United States Patent [19]
Stehlin et al.

[11] 3,995,229
[45] Nov. 30, 1976

[54] HIGH SLEW RATE OPERATIONAL AMPLIFIER CIRCUIT

[75] Inventors: Robert A. Stehlin, Richardson; John A. Bryan, Dallas, both of Tex.

[73] Assignee: The United States of America as represented by the Secretary of the Air Force, Washington, D.C.

[22] Filed: May 27, 1975

[21] Appl. No.: 581,177

[52] U.S. Cl. .................................. 330/17; 330/18; 330/30 D
[51] Int. Cl.² .......................................... H03F 3/68
[58] Field of Search ...................... 330/17, 18, 30 D

[56] References Cited
UNITED STATES PATENTS
3,551,832  12/1970  Graeme ............................... 330/17

Primary Examiner—Robert Segal
Assistant Examiner—Lawrence J. Dahl
Attorney, Agent, or Firm—Joseph E. Rusz; Willard R. Matthews, Jr.

[57] ABSTRACT

High reliability, very high slewing rates and fast settling times are realized in an operational amplifier circuit having a single externally controllable gain stage and an input stage that utilizes complementary bipolar transistors and dielectric isolation. The input stage comprises the parallel arrangement of two emitter-follower composite transistors. Each emitter-follower composite transistor consists of the parallel arrangement of two series connected NPN transistors and two series connected PNP transistors. The transistors are connected so that the base current of the PNP transistors supplies base current to the NPN transistors. Dielectric isolation is provided by means of $SiO_2$.

2 Claims, 1 Drawing Figure

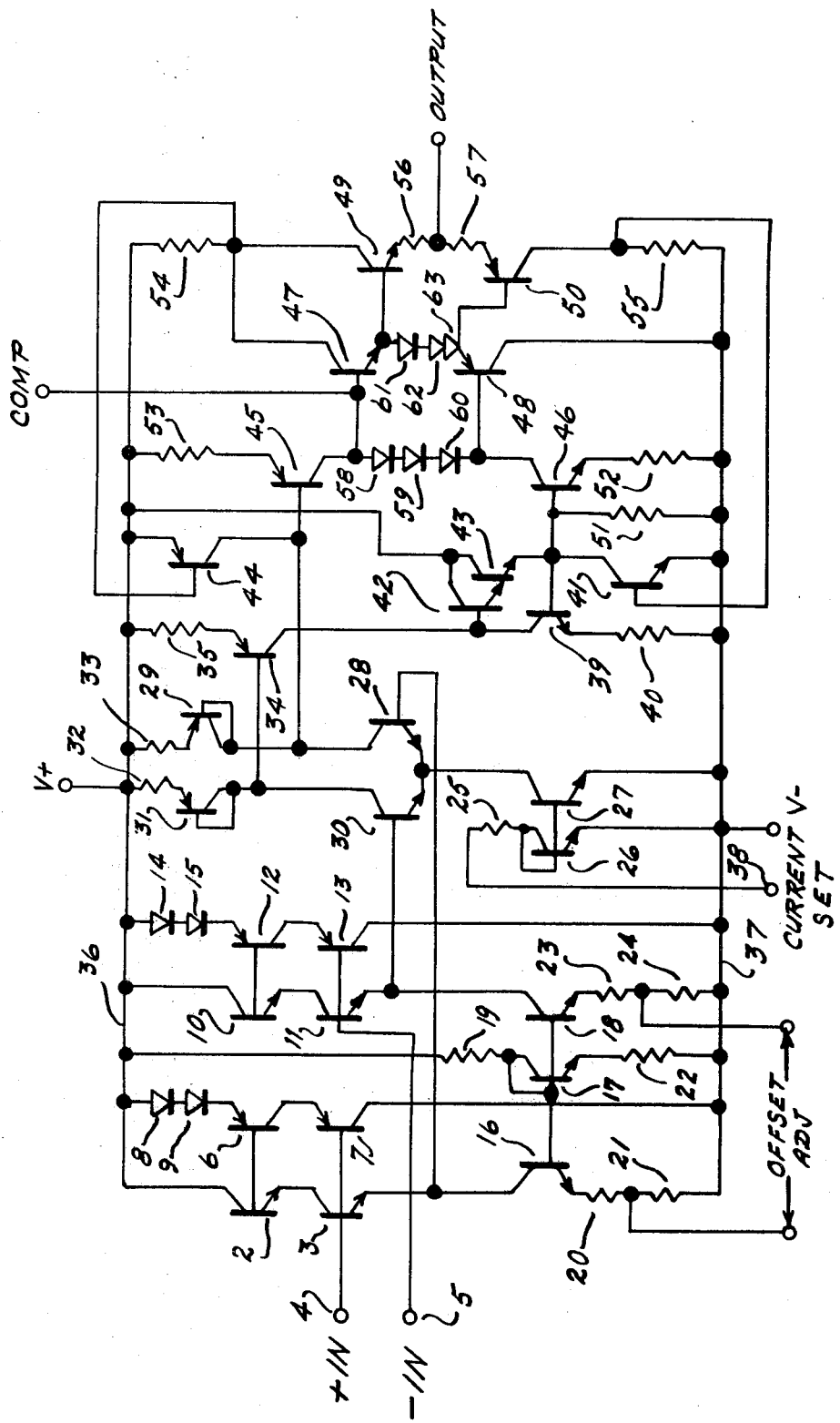

HIGH SLEW RATE OPERATIONAL AMPLIFIER CIRCUIT

STATEMENT OF GOVERNMENT INTEREST

The invention described herein may be manufactured and used by or for the Government for governmental purposes without the payment of any royalty thereon.

BACKGROUND OF THE INVENTION

This invention relates to operational amplifiers, and in particular to fast operating devices of that kind suitable for use in high speed, data-handling systems.

Operational amplifiers are often used as buffer amplifiers or voltage followers in high speed data handling systems and are a major factor in limiting system speed. Most commercially available operational amplifiers require several gain stages in order to achieve useable open loop voltage gain.

The design of any integrated circuit operational amplifier involves a compromise between voltage gain and slew rate (or bandwidth). Some high DC gain-high slew rate operational amplifiers are available in hybrid form which use large value feed-forward capacitors to change the effective circuit configuration at high frequencies. A typical state-of-the-art device is the *Harris Semiconductor*, Model HA 2520/2522/2525 operational amplifier which uses two gain stages with a Darlington input. The circuit achieves a slew rate of 120V/$\mu$ sec. by operating at a large amount of power (300 mW) and is unity gain stable. *Optical Electronics, Inc.* produces a fast hybrid operational amplifier designated as their model 9808. This amplifier has a slew rate of 2000V/$\mu$ sec. but dissipation up to 900 mW of quiescent power. It uses a standard integrated circuit to obtain high-low frequency gain and feed-forward to bypass the integrated circuit to obtain high speed operation. *National Semiconductor* uses a simple one gain stage circuit with FET inputs to achieve 500V/$\mu$ sec. in their LH0032/LH0032C "ultra fast operational amplifier". These amplifiers, however, are not unity gain stable and require large amounts of power (1.5 watts at 25° ambient). Hybrid amplifiers of the type exemplified by these and other state-of-the-art devices are bulky, expensive, and consume high power. Accordingly, there currently exists the need for an inexpensive low power operational amplifier having slew rates comparable to hybrid devices. The present invention is directed toward satisfying that need.

SUMMARY OF THE INVENTION

The invention comprehends a low-cost, high reliability, optimized operational amplifier that can readily be adapted to a totally monolithic construction. A complementary bipolar process (vertical NPN and PNP transistors) is used to avoid the poor high-frequency performance associated with lateral PNP transistors. In order to minimize parasitic capacitance the invention utilizes a dielectric (SiO$_2$) isolation process. The combination of an input comprising dielectrically isolated and complementary bipolar transistor together with a single externally controlled gain stage provides a simple, high performance structure. The input stage contains two emitter-follower composite transistors which consist of two NPN transistors, two PNP transistors, and two diodes. The transistors are connected so that the base current of the PNP transistor supplies base current to the NPN transistors. The resultant structure has a high input impedance and requires only low input bias currents.

It is a principal object of the invention to provide a new and improved operational amplifier circuit.

It is another object of the invention to provide an operational amplifier having higher slewing rates and faster settling times than currently available devices of that type.

It is another object of the invention to provide an inexpensive, low power, operational amplifier having slew rate comparable to state-of-the-art hybrid devices.

These, together with other objects, advantages and features of the invention, will become more readily apparent from the following detailed description when taken in conjunction with the illustrative embodiment in the accompanying drawing.

DESCRIPTION OF THE DRAWING

The sole FIGURE of the drawing is a schematic diagram of one presently preferred embodiment of the invention.

DETAILED DESCRIPTION OF THE PREFERRED EMBODIMENT

The schematic diagram of the drawing illustrates in detail the electrical circuit of the operational amplifier comprehended by the invention. The input stage comprises input terminals 4, 5, and two emitter-follower composite transistors. NPN transistors 2, 3, PNP transistors 6, 7, and diodes 8, 9, comprise the first composite transistor and NPN transistors 10, 11, PNP transistors 12, 13, and diodes 14, 15 comprise the second. The composite transistors are connected in parallel between positive voltage supply bus 36 and negative voltage supply bus 37. Offset adjustment is provided for by the circuit consisting of NPN transistors 16, 17, 18, and resistors 20, 21, 22, 23, 24. The single gain stage of the operational amplifier consists of PNP transistors 29, 31, 34, 45, NPN transistors 27, 28, 30, 39, 42, 43, 46, and resistors 32, 33, 40, 51, 52. External control of the current in the gain stage is provided for by means of current set terminal 38 and the circuit consisting of NPN transistor 26 and resistor 25. The output stage of the operational amplifier comprises PNP transistors 44, 48, 50, NPN transistors 41, 47, 49, diodes 58, 59, 60, 61, 62, 63, and resistors 54, 55, 56, 57. The output stage is of conventional design. The AC response of the circuit of the invention is unique in that as the power level of the gain stage is increased the voltage gain remains essentially constant but the bandwidth is increased.

While the invention has been described in its preferred embodiment, it is understood that the words which have been used are words of description rather than words of limitation and that changes within the purview of the appended claims may be made without departing from the scope and spirit of the invention in its broader aspects.

What is claimed is:

1. An operational amplifier circuit comprising
   an input stage having first and second input terminals,
   a gain stage,
   an output stage, and
   positive and negative voltage supply busses,
   said input stage comprising first and second NPN transistors connected in series between said positive and negative voltage supply busses, said first NPN transistor having its collector connected to the positive voltage supply bus and its emitter connected to the collector of said second NPN transistor, first and second PNP transistors connected in series between said positive and negative voltage supply busses, said first PNP transistor having its emitter connected to the positive voltage supply bus and its collector connected to the emitter of said second PNP transistor, the base of said first NPN transistor being connected to the base of said first PNP transistor and the base of said second NPN transistor being connected to the base of said second PNP transistor and to said first input terminal, third and fourth NPN transistors connected in series between said positive and negative voltage supply busses, said third NPN transistor having its collector connected to the positive voltage supply bus and its emitter connected to the collector of said fourth NPN transistor, and third and fourth PNP transistors connected in series between said positive and negative voltage supply busses, said third PNP transistor having its emitter connected to the positive voltage supply bus and its collector connected to the emitter of said fourth PNP transistor, the base of said third NPN transistor being connected to the base of said third PNP transistor and the base of said fourth NPN transistor being connected to the base of said fourth PNP transistor and to said second input terminal, and said gain stage comprising resistance means, a fifth PNP transistor and fifth and sixth NPN transistors connected in series between said positive and negative voltage supply busses, and resistance means, a sixth PNP transistor and a seventh NPN transistor connected in series between the positive voltage supply bus and the emitter of said fifth NPN transistor, the bases of said fifth and seventh NPN transistors being connected to said input stage and the collectors of said fifth and sixth PNP transistors being connected to said output stage.

2. An operational amplifier circuit as defined in claim 1 including means for controlling the power level of said gain stage.

* * * * *